United States Patent
Shimizu et al.

(10) Patent No.: US 9,269,587 B2
(45) Date of Patent: Feb. 23, 2016

(54) METHODS FOR ETCHING MATERIALS USING SYNCHRONIZED RF PULSES

(71) Applicant: Applied Materials, Inc., Santa Clara, CA (US)

(72) Inventors: Daisuke Shimizu, Saratoga, CA (US); Jong Mun Kim, San Jose, CA (US); Katsumasa Kawasaki, San Jose, CA (US); Sergio Fukuda Shoji, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/020,773

(22) Filed: Sep. 6, 2013

(65) Prior Publication Data
US 2015/0072530 A1    Mar. 12, 2015

(51) Int. Cl.
*H01L 21/3065* (2006.01)
*H01L 21/311* (2006.01)
*H01J 37/32* (2006.01)

(52) U.S. Cl.
CPC ....... *H01L 21/3065* (2013.01); *H01J 37/32091* (2013.01); *H01L 21/31116* (2013.01); *H01J 2237/334* (2013.01)

(58) Field of Classification Search
USPC .............. 216/67, 79; 438/710, 719, 723
See application file for complete search history.

(56) References Cited

U.S. PATENT DOCUMENTS

| | | | |
|---|---|---|---|
| 6,130,169 A * | 10/2000 | Shields et al. | ............... 438/725 |
| 6,235,643 B1 | 5/2001 | Mui et al. | |
| 6,753,264 B2 | 6/2004 | Li et al. | |
| 2002/0139658 A1 | 10/2002 | Kanakasabapathy et al. | |
| 2003/0228532 A1 | 12/2003 | Mui et al. | |
| 2004/0203177 A1 | 10/2004 | Davis et al. | |
| 2005/0064719 A1 | 3/2005 | Liu et al. | |
| 2006/0194439 A1 | 8/2006 | Sadjadi et al. | |
| 2010/0105209 A1 | 4/2010 | Winniczek et al. | |
| 2011/0031216 A1 * | 2/2011 | Liao et al. | ............... 216/67 |
| 2011/0318933 A1 | 12/2011 | Yatsuda et al. | |
| 2013/0009545 A1 * | 1/2013 | Benjamin et al. | ........ 315/111.21 |
| 2014/0020831 A1 * | 1/2014 | Ohgoshi et al. | ........... 156/345.28 |

FOREIGN PATENT DOCUMENTS

| | | |
|---|---|---|
| JP | 2000306894 A | 11/2000 |
| KR | 10-2011-0067567 A | 6/2011 |

OTHER PUBLICATIONS

PCT international search report and written opinion of PCT/US2014/048497 dated Nov. 11, 2014. The PCT search report is being used as the English translation for the Korean reference.

* cited by examiner

*Primary Examiner* — Shamim Ahmed
(74) *Attorney, Agent, or Firm* — Patterson & Sheridan, LLP

(57) ABSTRACT

Embodiments of the present invention provide methods for etching a material layer using synchronized RF pulses. In one embodiment, a method includes providing a gas mixture into a processing chamber, applying a first RF source power at a first time point to the processing chamber to form a plasma in the gas mixture, applying a first RF bias power at a second time point to the processing chamber to perform an etching process on the substrate, turning off the first RF bias power at a third time point while continuously maintaining the first RF source power on from the first time point through the second and the third time points, and turning off the first RF source power at a fourth time point while continuously providing the gas mixture to the processing chamber from the first time point through the second, third and fourth time points.

19 Claims, 4 Drawing Sheets

METHODS FOR ETCHING MATERIALS USING SYNCHRONIZED RF PULSES

BACKGROUND

1. Field

Embodiments of the present invention generally relate to methods for etching a material layer using synchronized RF pulses, and more particularly to methods etching a material layer using synchronized RF pulses in the semiconductor applications.

2. Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

A patterned mask, such as a photoresist layer, is commonly used in forming structures, such as gate structure, shallow trench isolation (STI), bite lines and the like, on a substrate by etching process. The patterned mask is conventionally fabricated by using a lithographic process to optically transfer a pattern having the desired critical dimensions to a layer of photoresist. The photoresist layer is then developed to remove undesired portion of the photoresist, thereby creating openings in the remaining photoresist.

In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. However, designs of the three dimensional (3D) stacking of semiconductor chips often further pushes the geometry limits of the structures against technology limits, the need for accurate process control for the manufacture of small critical dimensional structures with high aspect ratio has become increasingly important. Poor process control during etching process will result in irregular structure profiles and line edge roughness, thereby resulting poor line integrity of the formed structures. Additionally, irregular profiles and growth of the etching by-products formed during etching may gradually block the small openings used to fabricate the small critical dimension structures, thereby resulting in bowed, distorted, toppled, or twisted profiles of the etched structures.

Thus, there is a need for improved methods and apparatus that may etch a material layer with high aspect ratio, particularly for three dimensional (3D) stacking of semiconductor chips or other semiconductor devices with accurate process and profile control.

SUMMARY

Embodiments of the present invention provide an apparatus and methods for etching a material layer using synchronized RF pulses for manufacturing semiconductor devices, particularly for manufacturing three dimensional (3D) stacking of semiconductor chips. In one embodiment, a method of etching a material layer disposed on a substrate using synchronized RF pulses includes providing a gas mixture into a processing chamber having a substrate disposed therein, applying a first RF source power at a first time point to the processing chamber to form a plasma in the gas mixture, applying a first RF bias power at a second time point to the processing chamber to perform an etching process on the substrate, turning off the first RF bias power at a third time point applied to the processing chamber while continuously maintaining the first RF source power on from the first time point through the second and the third time points, and turning off the first RF source power at a fourth time point applied to the processing chamber while continuously providing the gas mixture to the processing chamber from the first time point through the second, third and fourth time points.

In another embodiment, a method for etching a material layer disposed on a substrate includes performing a pre-coating process on a substrate by supplying a gas mixture into a processing chamber and forming a plasma from the gas mixture by applying a first RF source power in the gas mixture, performing an etching process on the substrate by supplying a first RF bias power into the processing chamber while continuously applying the first RF source power in the processing chamber, and performing a post-coating process on the substrate by turning off the first RF bias power applied into the processing chamber while continuously applying the first RF source power in the processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides methods for etching a material layer for high aspect ratio features formed on a substrate for semiconductor devices, particularly for three dimensional (3D) stacking of semiconductor chips. In one embodiment, the etching process may use cycled and synchronized RF pulses during the etching process to provide multiple etching/deposition phases to etch the material layer. Multiple RF powers, such as multiple RF source or bias powers, may be used during the etching process to control etching profile and feature transfer.

Figure 1:
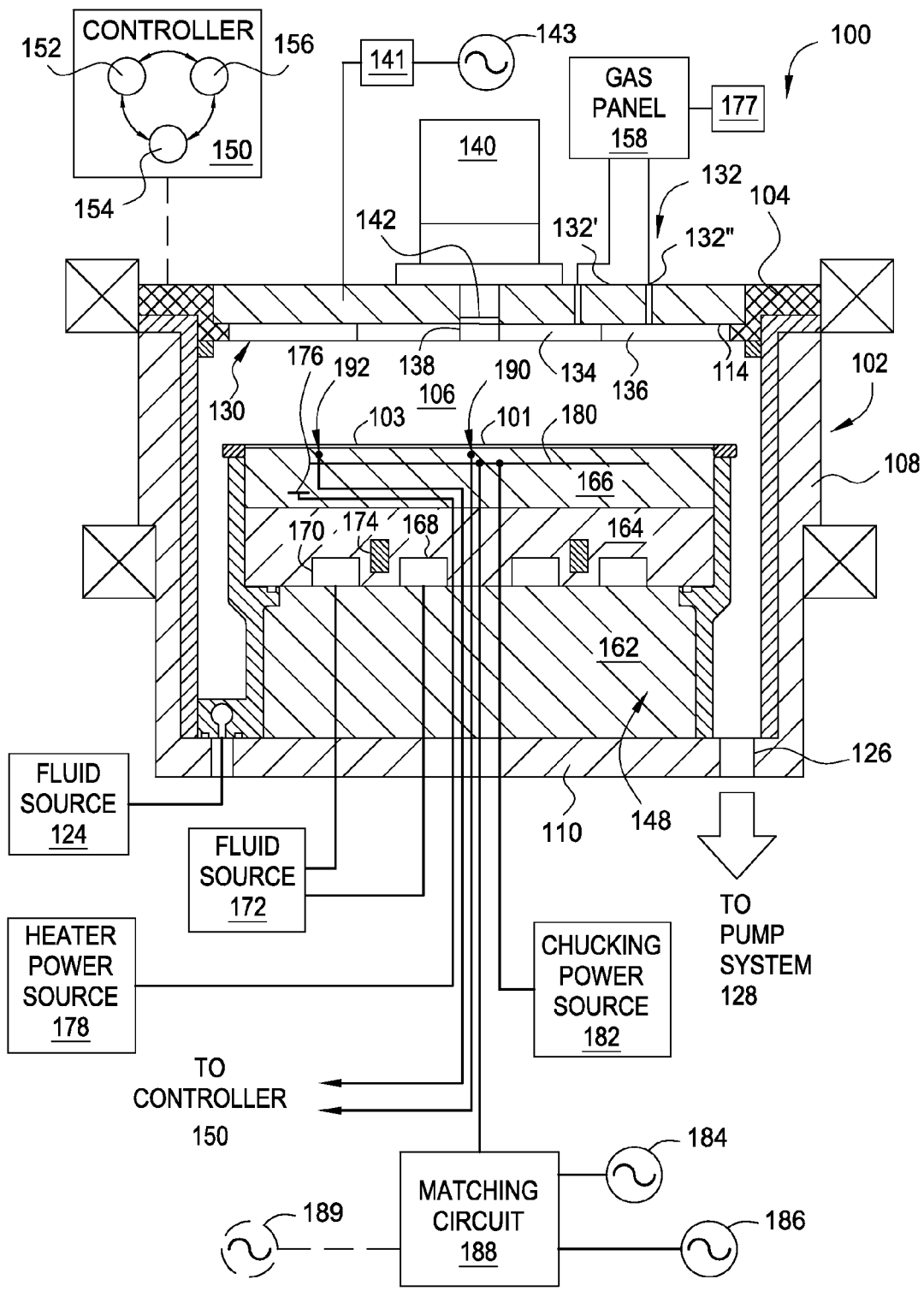
FIG. 1 depicts an apparatus utilized to performing an etching process using cycle and synchronized RF pulses.

FIG. 1 is a sectional view of one embodiment of a processing chamber 100 suitable for performing an etching process to etch a material layer on a substrate using cycled and synchronized RF pulses. Suitable processing chambers that may be adapted for use with the teachings disclosed herein include, for example, a modified ENABLER® processing chamber available from Applied Materials, Inc. of Santa Clara, Calif. Although the processing chamber 100 is shown including a plurality of features that enable superior etching and trimming performance, it is contemplated that other processing chambers may be adapted to benefit from one or more of the inventive features disclosed herein.

The processing chamber 100 includes a chamber body 102 and a lid 104 which enclose an interior volume 106. The chamber body 102 is typically fabricated from aluminum, stainless steel or other suitable material. The chamber body 102 generally includes sidewalls 108 and a bottom 110. A substrate support pedestal access port (not shown) is generally defined in a sidewall 108 and a selectively sealed by a slit valve to facilitate entry and egress of a substrate 101 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In one embodiment, the pump system 128 maintains the pressure inside the interior volume 106 at operating pressures typically between about 10 mTorr to about 500 Torr.

The lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one embodiment, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or the substrate 101 positioned on a substrate support pedestal assembly 148 through the window 142. In one embodiment, the optical monitoring system 140 is coupled to the lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the invention is the EyeD® full-spectrum, interferometric metrology module, available from Applied Materials, Inc., of Santa Clara, Calif.

A gas panel 158 is coupled to the processing chamber 100 to provide process and/or cleaning gases to the interior volume 106. In the embodiment depicted in FIG. 1, inlet ports 132', 132" are provided in the lid 104 to allow gases to be delivered from the gas panel 158 to the interior volume 106 of the processing chamber 100. In one embodiment, the gas panel 158 is adapted to provide fluorinated process gas through the inlet ports 132', 132" and into the interior volume 106 of the processing chamber 100. In one embodiment, the process gas provided from the gas panel 158 includes at least a fluorinated gas, chlorine, and a carbon containing gas, an oxygen gas, a nitrogen containing gas and a chlorine containing gas. Examples of fluorinated and carbon containing gases include $CHF_3$, $CH_2F_2$ and $CF_4$. Other fluorinated gases may include one or more of $C_2F$, $C_4F_6$, $C_3F_8$ and $C_5F_8$. Examples of the oxygen containing gas include $O_2$, $CO_2$, CO, $N_2O$, $NO_2$, $O_3$, $H_2O$, and the like. Examples of the nitrogen containing gas include $N_2$, $NH_3$, $N_2O$, $NO_2$ and the like. Examples of the chlorine containing gas include HCl, $Cl_2$, $CCl_4$, $CHCl_3$, $CH_2Cl_2$, $CH_3Cl$, and the like. Suitable examples of the carbon containing gas include methane ($CH_4$), ethane ($C_2H_6$), ethylene ($C_2H_4$), and the like.

A showerhead assembly 130 is coupled to an interior surface 114 of the lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate 101 being processed in the processing chamber 100.

A remote plasma source 177 may be optionally coupled to the gas panel 158 to facilitate dissociating gas mixture from a remote plasma prior to entering into the interior volume 106 for processing. A RF source power 143 is coupled through a matching network 141 to the showerhead assembly 130. The RF source power 143 typically is capable of producing up to about 3000 W at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 101 positioned on the substrate support pedestal assembly 148. The passage 138 may be a material, an aperture or plurality of apertures formed or disposed in the showerhead assembly 130 that is substantially transmissive to the wavelengths of energy generated by, and reflected back to, the optical monitoring system 140. In one embodiment, the passage 138 includes a window 142 to prevent gas leakage through the passage 138. The window 142 may be a sapphire plate, quartz plate or other suitable material. The window 142 may alternatively be disposed in the lid 104.

In one embodiment, the showerhead assembly 130 is configured with a plurality of zones that allow for separate control of gas flowing into the interior volume 106 of the processing chamber 100. In the embodiment FIG. 1, the showerhead assembly 130 as an inner zone 134 and an outer zone 136 that are separately coupled to the gas panel 158 through separate inlet ports 132', 132".

The substrate support pedestal assembly 148 is disposed in the interior volume 106 of the processing chamber 100 below the gas distribution (showerhead) assembly 130. The substrate support pedestal assembly 148 holds the substrate 101 during processing. The substrate support pedestal assembly 148 generally includes a plurality of lift pins (not shown) disposed therethrough that are configured to lift the substrate 101 from the substrate support pedestal assembly 148 and facilitate exchange of the substrate 101 with a robot (not shown) in a conventional manner. An inner liner 118 may closely circumscribe the periphery of the substrate support pedestal assembly 148.

In one embodiment, the substrate support pedestal assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among others, to the base 164 and the electrostatic chuck 166. The electrostatic chuck 166 comprises at least one clamping electrode 180 for retaining the substrate 101 below showerhead assembly 130. The electrostatic chuck 166 is driven by a chucking power source 182 to develop an electrostatic force that holds the substrate 101 to the chuck surface, as is conventionally known. Alternatively, the substrate 101 may be retained to the substrate support pedestal assembly 148 by clamping, vacuum or gravity.

At least one of the base 164 or electrostatic chuck 166 may include at least one optional embedded heater 176, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, thereby heating and/or cooling the electrostatic chuck 166 and ultimately, the temperature profile of the substrate 101 disposed thereon. The temperature of the electrostatic chuck 166 and the base 164 may be monitored using a plurality of temperature sensors 190, 192. The electrostatic chuck 166 may further comprise a plurality of gas passages (not shown), such as grooves, that are formed in a substrate support pedestal supporting surface of the chuck 166 and fluidly coupled to a source of a heat transfer (or backside) gas, such as He. In operation, the backside gas is provided at controlled pressure into the gas passages to enhance the heat transfer between the electrostatic chuck 166 and the substrate 101.

In one embodiment, the substrate support pedestal assembly 148 is configured as a cathode and includes an electrode 180 that is coupled to a plurality of RF power bias sources 184, 186. The RF bias power sources 184, 186 are coupled between the electrode 180 disposed in the substrate support pedestal assembly 148 and another electrode, such as the showerhead assembly 130 or ceiling (lid 104) of the chamber body 102. The RF bias power excites and sustains a plasma discharge formed from the gases disposed in the processing region of the chamber body 102.

In the embodiment depicted in FIG. 1, the dual RF bias power sources 184, 186 are coupled to the electrode 180 disposed in the substrate support pedestal assembly 148 through a matching circuit 188. The signal generated by the RF bias power 184, 186 is delivered through matching circuit 188 to the substrate support pedestal assembly 148 through a single feed to ionize the gas mixture provided in the plasma processing chamber 100, thereby providing ion energy necessary for performing a deposition or other plasma enhanced process. The RF bias power sources 184, 186 are generally capable of producing an RF signal having a frequency of from about 50 kHz to about 200 MHz and a power between about 0 Watts and about 5000 Watts. An additional bias power source 189 may be coupled to the electrode 180 to control the characteristics of the plasma.

In one mode of operation, the substrate 101 is disposed on the substrate support pedestal assembly 148 in the plasma processing chamber 100. A process gas and/or gas mixture is introduced into the chamber body 102 through the showerhead assembly 130 from the gas panel 158. A vacuum pump system 128 maintains the pressure inside the chamber body 102 while removing deposition by-products.

A controller 150 is coupled to the processing chamber 100 to control operation of the processing chamber 100. The controller 150 includes a central processing unit (CPU) 152, a memory 154, and a support circuit 156 utilized to control the process sequence and regulate the gas flows from the gas panel 158. The CPU 152 may be any form of general purpose computer processor that may be used in an industrial setting.

The software routines can be stored in the memory 154, such as random access memory, read only memory, floppy, or hard disk drive, or other form of digital storage. The support circuit 156 is conventionally coupled to the CPU 152 and may include cache, clock circuits, input/output systems, power supplies, and the like. Bi-directional communications between the controller 150 and the various components of the processing system 100 are handled through numerous signal cables.

Figure 2:
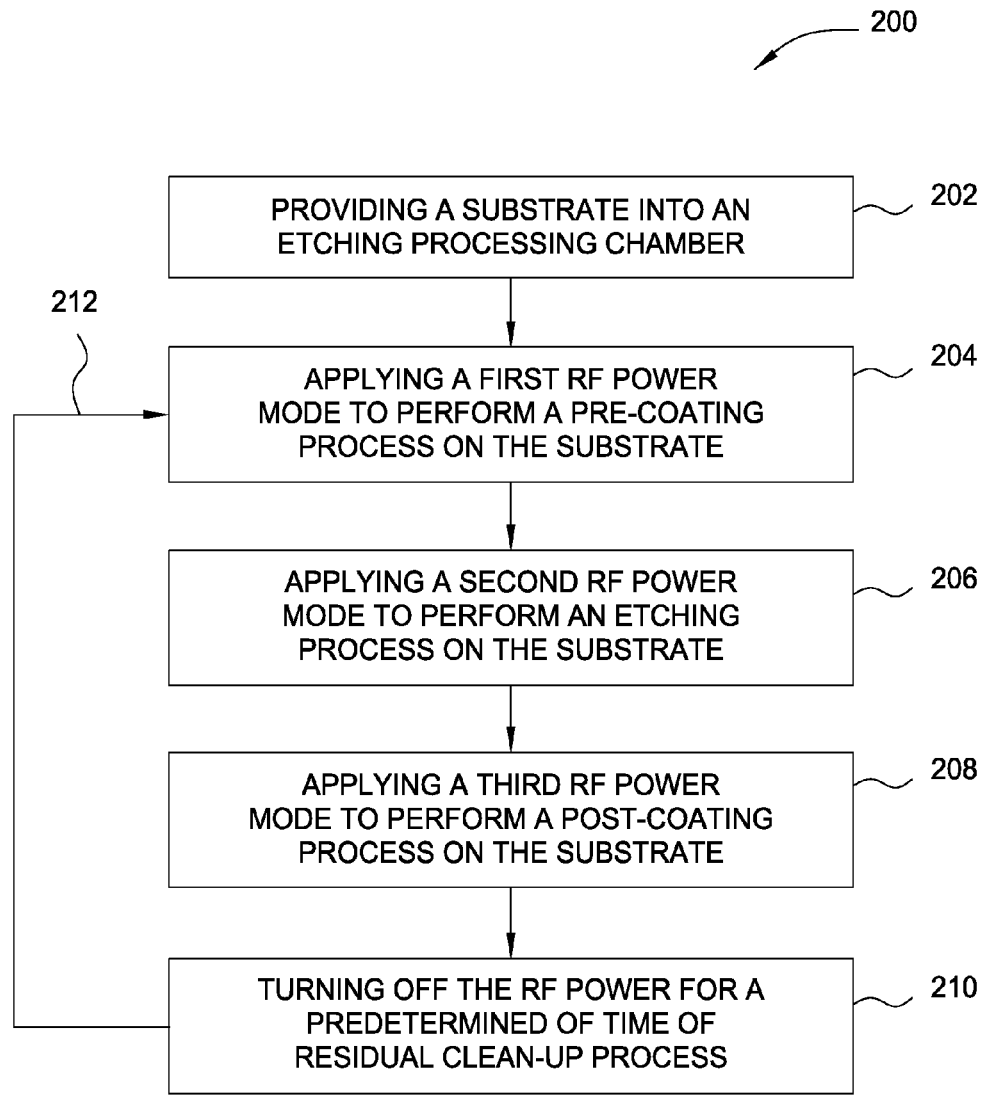
FIG. 2 depicts a flow diagram of a method for performing an etching process using cycle and synchronized RF pulses using the apparatus of FIG. 1.

FIG. 2 is a flow diagram of one embodiment of an etch process 200 that may be practiced in the chamber 100 or other suitable processing chamber. FIGS. 3A-3F are schematic cross-sectional views of a portion of a composite substrate corresponding to various stages of the process 200. The process 200 may be utilized to form high aspect ratio features, e.g., greater than 20:1, for structures, for semiconductor devices, particularly for three dimensional (3D) stacking of semiconductor memory. Alternatively, the process 200 may be beneficially utilized to etch other types of structures.

The process 200 begins at block 202 by transferring (i.e., providing) a substrate, such as the substrate 101, to an etch process chamber, such as the etch chamber 100 depicted in FIG. 1. The substrate 101 may have a substantially planar surface, an uneven surface, or a substantially planar surface having a structure formed thereon. In the embodiment depicted in FIG. 3A, the substrate 101 has a patterned mask layer 304 disposed on a material layer 302. In one embodiment, the material layer 302 may be utilized to form a gate structure, a contact structure or an interconnection structure in the front end or back end processes. In one embodiment, the method 200 may be performed on the material layer 302 to form a contact structure therein. The substrate 101 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 402 may have various dimensions, such as 200 mm, 300 mm, 450 mm or other diameter wafers, as well as, rectangular or square panels. Unless otherwise noted, embodiments and examples described herein are conducted on substrates with a 200 mm diameter, a 300 mm diameter, or a 450 mm diameter substrate. In the embodiment wherein a SOI structure is utilized for the substrate 101, the substrate 101 may include a buried dielectric layer disposed on a silicon crystalline substrate. In the embodiment depicted herein, the substrate 101 may be a crystalline silicon substrate.

In one embodiment, the material layer 302 is a dielectric layer. The patterned mask layer 304 has an open feature 306 that expose portions 308 of the material layer 302 for etching. In one embodiment, the mask layer 304 may be a hard mask, a photoresist mask or a combination thereof. The open feature 306 in the mask layer 304 is used as an etch mask to form open features 360 in the material layer 302 with desired aspect ratios. The open features 360 described herein may include trenches, vias, openings and the like. In one embodiment, the mask layer 304 may be a material selected from a group consisting of silicon, silicon oxide, silicon nitride, silicon oxynitride, silicon carbide, amorphous carbon, and combinations thereof. In an exemplary embodiment depicted herein, the mask layer 304 is an amorphous carbon layer. One example of the amorphous carbon layer may be an Advanced Patterning Film™ (APF) available from Applied Materials, Inc. In some embodiments, the mask layer 304 may be a patterned photoresist layer, such as a lithographically patterned mask. The photoresist layer may is a positive tone photoresist, a negative tone photoresist, a UV lithography photoresist, an i-line photoresist, an e-beam resist (for example, a chemically amplified resist (CAR)) or other suitable photoresist. In yet another embodiment, the mask layer 304 may be a combination of a photoresist layer disposed on a hardmask layer.

The material layer 302 may be a dielectric layer, such as a dielectric oxide layer. The material layer 302 may include multiple layers, composite layers, or a single layer. Other suitable materials for the dielectric layer include undoped silicon glass (USG), such as silicon oxide or TEOS, boron-silicate glass (BSG), phosphorus-silicate glass (PSG), boron-phosphorus-silicate glass (BPSG), silicon nitride, alphamos silicon, and combinations thereof. The material layer 302 may also be a composite layer including silicon oxide and polysilicon or silicon oxide and silicon nitride. In an exemplary embodiment depicted herein, the material layer 302 is an undoped silicon glass (USG) layer. In one embodiment, the dielectric layer 302 has a thickness between about 3000 Å to about 30000 Å, such as between about 4000 Å to about 40000 Å, for example about 20000 Å.

Figure 3A:
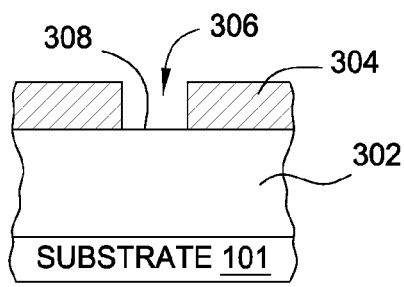
FIG. 3A-3F depict one embodiment of a sequence for etching a material layer formed on a substrate using cycle and synchronized RF pulses during the etching process.
Figure 3B:
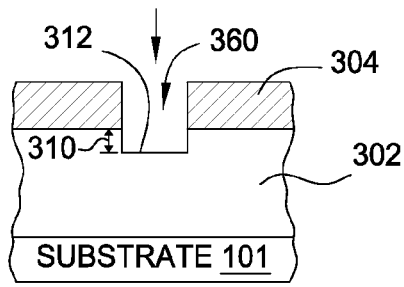

In one embodiment, the material layer 302 may be etched to a predetermined depth 310 to expose a portion 312 of the material layer 302, as shown in FIG. 3B. The material layer 302 may be etched in any suitable etching process. The material layer 302 may be etched by supplying a gas mixture into the processing chamber along with a preliminary RF power applied to the processing chamber. The gas mixture includes at least one fluorine and carbon based gas to anisotropically etch the material layer 302 disposed on the substrate 101. A preliminary RF mode may be applied in the gas mixture to form a plasma to gently etch the material layer 302 so as to pertain a vertical etching profile of the feature 360 formed in the material layer 302. In one embodiment, the preliminary RF power mode may include a RF source power at a frequency at about 162 MHz and optionally a RF bias power at a frequency of about 60 MHz.

During processing, the fluorine and carbon based gases are dissociated as reactive etchants by the plasma formed from the gas mixture. The fluorine ions dissociated from fluorine and carbon based gases in the gas mixture react with and attack the material layer 302 through the opening features 306 defined by the mask layer 314. In one embodiment, in order to maintain the profile and proper critical dimension of the feature 360 formed in the material layer 302 and also prevents the mask layer 304 from early consumption during etching, the carbon based gas selected to be added into the gas mixture is a polymer-rich carbon containing gas. The polymer-rich carbon containing gas generates polymers, when dissociated by the plasma in the gas mixture, forming polymer passivation on sidewall and exposed surface of the mask layer 304 and the material layer 302 to protect the mask layer 304 and sidewalls of the features 360 formed in the material layer 302 from being overly etched and attacked during early stage of the etching process.

In one embodiment, the polymer-rich carbon containing gas includes $C_4F_6$, $C_4F_8$, and $C_2F_2$, and the like that may provide polymers, e.g., carbon atoms, during etching. Examples of the fluorine based gas supplied in the gas mixture includes $CF_4$, $CHF_3$, $C_2F_6$, $C_4F_6$, $C_5F_8$, $CH_2F_2$, $SF_6$, $NF_3$, and the like. In an exemplary embodiment, the polymer-type carbon based gas used in the gas mixture is $CH_4$ and the fluorine and carbon based gas is $C_4F_6$.

An inert gas may be optionally supplied with the gas mixture to assist carrying the gas mixture into the etch chamber. Suitable examples of the inert gases include $N_2$, Ar, He, Xe and Kr gas. Additionally, a carrier gas, or some other gases may also be added into the gas mixture to assist carrying gas into the processing chamber for processing and promote completed reaction. Suitable examples of the carrier gas include $N_2$, $O_2$, $N_2O$, $NO_2$, $NH_3$, $H_2O$, $O_3$, and the like.

Several process parameters are regulated while the etching gas mixture is supplied into the etch chamber applying the preliminary RF power. In one embodiment, the chamber pressure is regulated between about 5 mTorr to about 400 mTorr, for example, at about 40 mTorr. The preliminary RF power mode may include at least a RF source power and a RF bias power. The RF source power may be applied to maintain a plasma formed from the gas mixture. For example, a RF source power of about 200 Watts to about 3000 Watts may be applied to an capacitively coupled antenna source to maintain a plasma inside the etch chamber. A RF bias power of about 200 Watts to about 10000 Watts may be applied to the processing chamber. The fluorine based gas may be flowed into the chamber at a rate between about 30 sccm to about 300 sccm. The polymer-rich carbon containing gas may be flowed into the chamber at a rate between about 0 sccm to about 500 sccm. A substrate temperature is maintained between about −10 degrees Celsius to about 60 degrees Celsius.

Additionally, the ratio of the fluorine and carbon gas to the polymer-rich carbon containing gas supplied in the etching gas mixture may be controlled. In one embodiment, the gas ratio of the fluorine based gas to the polymer-rich carbon containing gas is controlled between about 1:0 to about 1:30, for example, about 1:5.

In this preliminary step, the features 360 formed in the dielectric material 302 may have a depth 310 between about 0 nm and about 200 nm. Alternatively, the etched depth 310 may be controlled at about 0 percent to about 10 percent to the total depth desired to be etched for forming the features 360 in the dielectric layer 302.

Figure 3C:
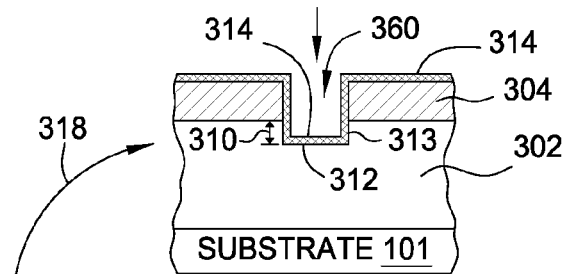

At block 204, after the material layer 302 is etched to the predetermined depth 310, a first RF power mode is supplied into the processing chamber along with the gas mixture to perform a pre-coating process to deposit a pre-coating layer 314 on the substrate 101, as shown in FIG. 3C. The gas species supplied in the gas mixture may stay the same or change as needed. As discussed above, during the etching process, sidewall 313 of the features 306 may also be attacked by the aggressive etchants that may adversely generate lateral etching to the material layer 302, resulting in undesired profile deformation. By depositing a pre-coating layer 314 on the sidewall 313 and bottom surface 312 of the features 306 as well as a top surface of the mask layer 304, the sidewalls 313 and the top surface of the mask layer 304 is protected from etching during the subsequent etching processing, thereby preventing feature sidewall attack conventionally occurred during the etching process.

In one embodiment, the first RF power mode includes providing a RF source power having a RF frequency of about 162 MHz. When performing the first RF power mode, a bias power may be eliminated (i.e., turned off), only the RF source power is used to deposit the pre-coating layer 314 without specific directionality. The pre-coating process is performed until a desired thickness of the pre-coating layer 314 is reached. In one embodiment, the pre-coating layer 314 has a thickness between about $1 \times 10^{-5}$ nm and about $3 \times 10^{-5}$ nm.

In one embodiment, the process parameters may be similar to the process parameters regulated while applying the preliminary RF power mode described above.

Figure 3D:
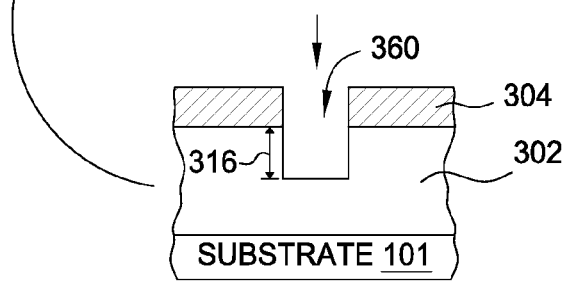

At block 206, a second RF power mode is utilized to etch the material layer 302 to a second predetermined depth 316, as shown in FIG. 3D. During the etching process, the pre-coating layer 314 may be consumed and etched away, thereby exposing the underlying sidewall 313 of the open feature 360 in the material layer 302 without protection during the subsequent processes. Accordingly, the second RF power mode may be utilized to etch the material layer 302 until the predetermined depth 316 is reached and/or the pre-coating layer 314 is consumed and etched away from the substrate 101.

In one embodiment, the second RF power mode includes using at least a RF source power and at least a RF bias power. In some embodiment, dual RF bias powers may be utilized to assist providing directionality to the plasma generated during the etching process. In one embodiment, the RF source power is provided at about 162 MHz. The RF bias power may be provided at 60 MHz and/or 2 MHz as needed. In one particular embodiment of the second RF power mode, the RF source power is provided at about 162 MHz and the RF bias power is provided at 60 MHz. In another embodiment of the second RF power mode utilizes dual RF bias powers, wherein the RF source power is provided at about 162 MHz and a first RF bias power is provided at 60 MHz and a second RF bias power is provided at 2 MHz.

Figure 3E:
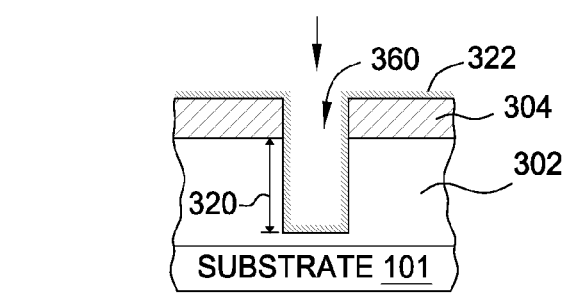

It is noted that the block 204 and 206 may be repeatedly (i.e., cyclically) performed, as indicated by the loop 318 in FIG. 3, until a desired target depth 320 of the feature 360 is formed in the material layer 302, as shown in FIG. 3E, which will be discussed further below. In one embodiment, the desired target depth 320 may be between about $1 \times 10^{-4}$ nm and about $5 \times 10^{-4}$ nm. The repeated processes may cyclically and incrementally etch the material layer 302 without over aggressively attacking the material layer 302. Incremental etching with repetitive deposition and removal of the pre-coating layer 304 and material layer 302 improves feature verticality and enhances accuracy of mask to feature CD transfer between the mask 304 and the material layer 302. In one embodiment, the feature 360 may have a critical dimension less than 80 nm.

In the embodiment wherein the pre-coating layer 314 has sufficient thickness to sustain and minimize the mask layer loss during the etching process until the desired target depth 320 is reached, the process at the block 204 and 206 may only be performed once to finish forming the feature 360 in the material layer 302.

At block 208, after the feature 360 with the desired target depth 320 is formed in the material layer 302, a third RF power mode may be applied in the gas mixture to perform a post coating process, forming a post-coating layer 322 lining on sidewall 313 and the bottom surface 330 of the feature 306, as shown in FIG. 3E. The post-coating layer 322 may assist repairing dangling bonds on sidewalls 313 of the material layer 302 and filling in the interstitial lattice sites/vacancies caused during the etching process, and assist obtaining the features 306 with a vertical sidewall profile and robust interface/etched surface.

In one embodiment, the third RF power mode includes providing a RF source power having a RF frequency of about 162 MHz to form the post-coating layer 322. When performing the third RF power mode, the bias power may be eliminated (i.e., turning off), or the RF source power is provided at about 162 MHz and bias power is provided at about 60 MHz, so that only using the high frequency RF power is used to generally deposit the post-coating layer 322 on the etched substrate 101 without specific directionality. The post-coating process is performed until a desired thickness of the post-coating layer 322 is reached. In one embodiment, the post-coating layer 322 has a thickness between about $1 \times 10^{-5}$ nm and about $3 \times 10^{-5}$ nm.

Figure 3F:
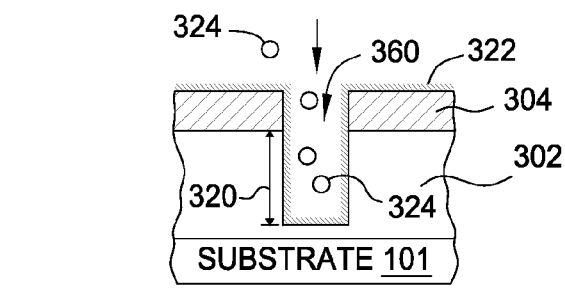

At block 210, after the post-coating layer 322 is formed on the features 306 with desired dimension, e.g., the desired depth 320, the third RF power mode includes that the RF source power or RF source and bias power applied to the processing chamber 100 be turned off while remaining supplying the gas mixture to the processing chamber to perform a pump/purge process. The gas mixture remained in the processing chamber may remove and/or pump away the processing residuals 324 from the substrate surface, as shown in FIG. 3F, thereby assisting maintaining cleanliness of the substrate 101. In one embodiment, the gas mixture supplied during the pump/purge process includes inert gas, such as Ar or He.

It is noted that the process steps from block 204 to block 210 may be repeatedly performed, as indicated by the loop 212, to incrementally etch the feature 306 until the desired dimension, including depth 320 and/or the width of the feature 306, is reached.

Figure 4A:
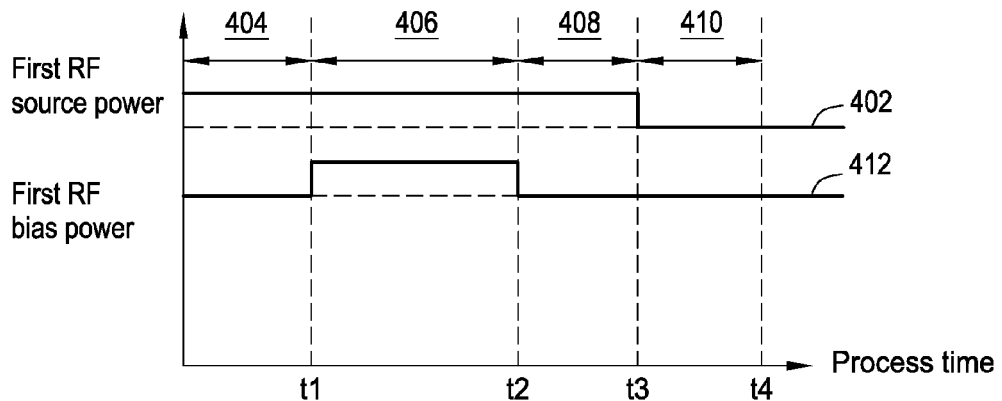
FIGS. 4A-4C depict different embodiments of multiple RF power settings during an etching process.

FIG. 4A depicts one embodiment of a RF power setting in different RF power modes during the etching process described above with referenced to FIGS. 2 and 3A-3F. For example, in the embodiment depicted in FIG. 4A, a first time period 404, performed from the beginning of the process to a first time point $t_1$, is configured to perform the process at block 204 of FIG. 2 with the first RF mode. In the first time period 404, a first RF source power, as shown by a trace line 402, is turned on to perform the pre-coating process while no bias power, as shown by a trace line 412, is applied. In this particular process, the pre-coating layer 314 is then formed onto the surface of the substrate 101 in the first RF mode with only the first RF source power 402 turned on.

Subsequently, in a second time period 406, starting from the first time point $t_1$ to a second time point $t_2$, the second RF power mode, as described above at block 206, is performed to turn on the first RF bias power 412 while also maintaining the first RF source power 402 on to perform the main etching process to etch the features 306 in the material layer 302, as shown in FIG. 3D. The second time point $t_2$ may be between about 10 microseconds and about 8800 microseconds delayed from the first time point $t_1$ during the etching process. Synchronized application of the first RF source power and the first RF bias power applied to the processing chamber assists to dissociate gases from the etching gas mixture to form ions with specific directionality, performing an anisotropic etching process forming the feature 306 with desired vertical profile. In one embodiment, the second time period 406 as performed may be as long as needed until the desired depth 316 is formed in the material layer 302. In some embodiments, the first RF power mode in the first time period 404 and the second RF power mode in the second time period 406 may be repeatedly performed to incrementally etch the feature 306 until a final and desired depth 320 is reached. In some other embodiments, the first time period 404 and the second time period 406 may only need to be one-time performed to pre-coat and then etch to form the feature 306 with desired final depth 320 in the material layer 302 as needed.

Following the second time period 406, a third time period 408, from the second time point $t_2$ to a third time point $t_3$, the first RF bias power 412 is then turned off while only maintaining the first RF source power 402 on to perform the post-coating process as described at block 208, forming the post-coating layer 322 on the substrate 101, as shown in FIG. 3E. In the final step of a fourth time period 410, both the first RF bias power 412 and the first source RF power 402 are turned off, while only maintaining the gas mixture supplied to the processing chamber to perform the pump/purge process, as described at block 210, to remove etching residuals 324, as shown in FIG. 3F.

In one embodiment, the first time period 404 may be between about 1 microseconds and about 4000 microseconds. The second time period 406 is between about 10 microseconds and about 8800 microseconds. The third time period 408 is between about 1 microseconds and about 4000 microseconds. The fourth time period 410 is between about 10 microseconds and about 8800 microseconds.

By utilizing synchronization of both RF source power and RF bias power at different stages of an etching process, different process performance may be obtained, e.g., alternating deposition or etching phases, so as to enable etching features with high aspect ratio and small dimensions with sufficient sidewall protection. In other words, by periodically pulsing RF bias power at different stages of the etching process, switch among the deposition process, the etching process, and a pump/purge process may be obtained to etch the features utilizing different deposition/etching mechanisms so as to obtain features with desired profiles and dimensions.

Figure 4B:
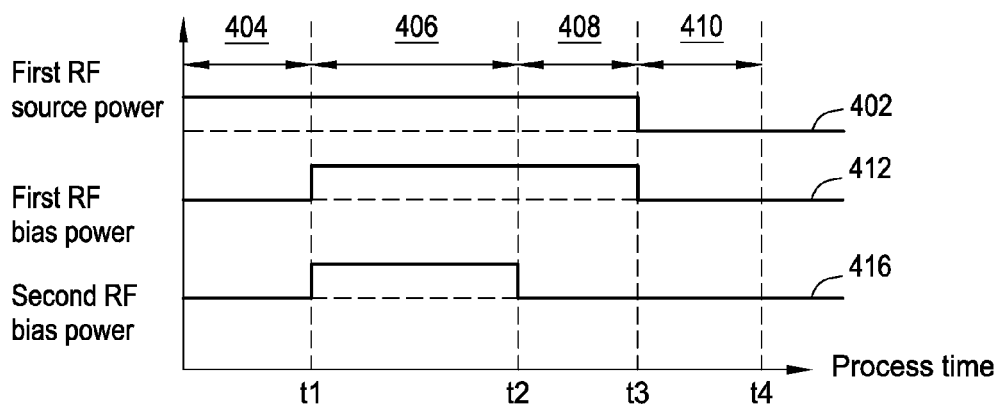

FIG. 4B depicts another embodiment for etching the features 306 in the material layer 302 utilizing multiple RF source and bias powers at different time periods during the etching process. As discussed above, in the first time period 404 of the etching process, only the first RF source power 402 is applied to perform a pre-coating process. In the second time period 406, a second RF bias power 416 in addition to the first RF bias power 412 are then applied to the processing chamber to assist dissociating the gas mixture to generate ions with desired directionality. It is believed that addition of the second RF bias power 416 may assist enhancing directionality of the dissociated ions to penetrate to the bottom 330 of the features 306 during etching, thereby preventing early close-up of the features 306 and elongating the ion trajectory.

In the third time period 408 of FIG. 4B, as the features 306 with high aspect ratio and small dimension may already be formed in the material layer 302, the second RF bias power 416 is then turned off while still maintaining the first RF bias power 412 on to provide directionality to the ions during the post-coating process, assisting the ions to further reach down to the bottom 330 of the features 306, forming the post-coating layer 322 with high conformity within the features 306. Subsequently, in the fourth time period 410, all first RF source power 402, the first RF bias power 412 and the second RF bias power 416 are then turned off, only maintaining the gas mixture on to perform the pump/purge process to clean etching residuals. In this stage, the gas mixture may include an inert or a carrier gas, such as Ar, He, $N_2$, $H_2$, $O_2$, or the like.

Figure 4C:
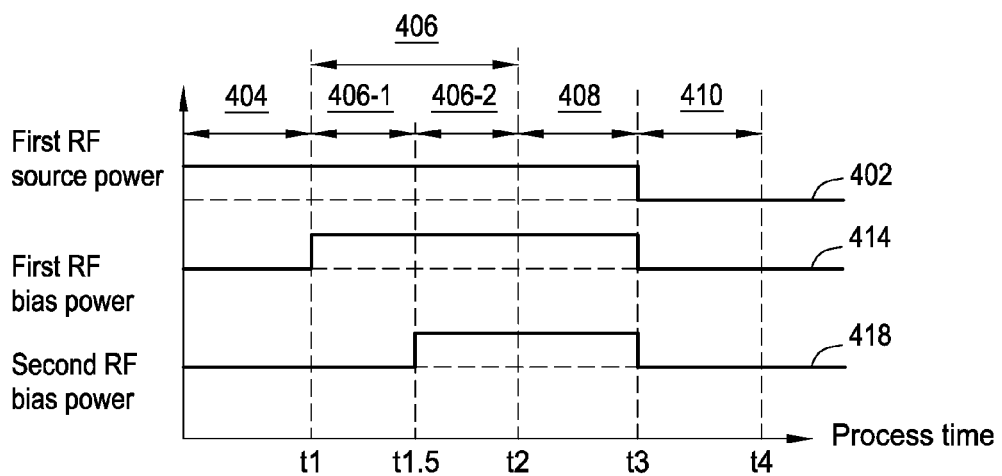

FIG. 4C depicts yet another embodiment regarding how the multiple RF powers may be synchronized or pulsed during the etching process to optimize the etching results, obtaining the features 306 of high aspect ratio and small dimensions with desired cleanliness on the substrate surface. Similar to the embodiment depicted above in FIGS. 4A and 4B, in FIG. 4C, a first RF bias power 414 may be applied to the etching gas mixture in both the second time period 406 and the third time period 408. A second RF bias power 418 may also be applied in the gas mixture during the second time period 406 while having a delay time at a time point $t_{1.5}$, as compared to the time point $t_1$ when the first RF bias power 414 is applied to the processing chamber. After the first RF bias power 414 is applied to the processing chamber for an initial time period 406-1 in the second time period 406, the second RF bias power 418 may then be applied to the processing chamber at the time point $t_{1.5}$ for a final time period 406-2 in the second time period 406. The delayed application of the second RF bias power 418 may avoid generating aggressive bias power delivered to the substrate 101 which may adversely sputter or bombard the substrate 101, thereby eliminating likelihood of substrate damage or chamber arcing. Furthermore, the first RF bias power 414 and the second bias power 418 may also both be continuously applied to the processing chamber during the post-coating process in the third time period 408 to assist the deposition process. In the final step in the fourth time period 410, the first RF source power 402, the first RF bias power 414 and the second RF bias power 418 may then be all terminated while only keeping the gas mixture flowing to perform the pump/purge process for etching residuals removal.

It is noted that in general configurations, the first RF source power 402 is maintained on during the first, second and the third time period 404, 406, 408 during the etching process while the first RF bias power 412, 414 and/or the second RF bias power 416, 418 may be optionally turned on in any time point during the second and the third time period 406, 408 during the etching process when enhancement of the dissociated ion directionality is needed to perform the anisotropic etching process.

Thus, methods for forming features with high aspect ration and small dimension are obtained by utilizing synchronization of multiple RF power pulses during an etching process. By synchronizing one or more RF bias powers pulsed at different time points during the etching process while maintaining a continuous RF source power, both deposition/etching phases may be obtained during the etching process, so as to optimize the etching process while providing sufficient sidewall deposition/protection during the etching process. By doing so, an improved etching process to obtain features with high aspect ratio and small dimension, particularly for applications in three dimensional (3D) stacking of semiconductor chip, is obtained.

While the foregoing is directed to embodiments of the present invention, other and further embodiments of the invention may be devised without departing from the basic scope thereof, and the scope thereof is determined by the claims that follow.

The invention claimed is:

1. A method of etching a material layer disposed on a substrate using synchronized RF pulses comprising:
   providing a gas mixture into a processing chamber having a substrate disposed therein;
   applying a first RF source power at a first time point to the processing chamber to form a plasma in the gas mixture;
   applying a first RF bias power at a second time point and a third time point to the processing chamber to perform an etching process on the substrate while continuously applying the first RF source power in the processing chamber from the first time point through the second and the third time points;
   applying a second RF bias power at the second time point while continuously applying the first RF bias power and the first RF source power in the processing chamber;
   turning off the second RF bias power at the third time point applied to the processing chamber while continuously maintaining the first RF source and the first RF bias power on from the second time point through the third time points; and
   turning off the first RF source power and the first RF bias power at a fourth time point applied to the processing chamber while continuously providing the gas mixture to the processing chamber from the first time point through the second, third and fourth time points.

2. The method of claim 1, further comprising:
   applying a preliminary RF source power to the processing chamber prior to applying the first RF source power in the gas mixture.

3. The method of claim 2, wherein applying the preliminary RF source power further comprises:

applying a preliminary RF bias power to the processing chamber while applying the preliminary RF source power.

4. The method of claim 1, wherein applying the first RF source power at the first time point further comprises:
applying the first RF source power for a first time period between about 1 microseconds and about 4000 microseconds.

5. The method of claim 1, wherein applying the first RF source power at the first time point further comprises:
performing a pre-coating process to form a pre-coating layer on the substrate.

6. The method of claim 1, wherein applying the first RF bias power at the second time point further comprises:
applying the first RF bias power between about 10 microseconds and about 8800 microseconds.

7. The method of claim 1, wherein turning off the second RF bias power at the third time point further comprises:
continuously applying the first RF source power for between about 1 microseconds and about 4000 microseconds.

8. The method of claim 7, wherein continuously applying the first RF source power in the processing chamber further comprises:
performing a post-coating process to form a post-coating layer on the substrate.

9. The method of claim 1, wherein continuously supplying the gas mixture into the processing chamber for at fourth time period comprises supplying the gas mixture for between about 10 microseconds and about 8800 microseconds.

10. The method of claim 9, further comprising:
performing a pump/purge process in the processing chamber while continuously supplying the gas mixture.

11. The method of claim 9, wherein the gas mixture continuously supplied to the processing chamber during the fourth time period includes an inert gas or a carrier gas.

12. The method of claim 1, wherein the gas mixture includes at least a fluorine based gas and a polymer-rich carbon containing gas.

13. The method of claim 1, wherein the first RF source power has a frequency of about 162 MHz.

14. The method of claim 1, wherein the first RF bias power has a frequency of about 60 MHz.

15. The method of claim 1, wherein the step of the applying the first RF source power at the first time point and the step of applying the first RF bias power and the second RF bias power at the second time point are repeatedly performed.

16. A method for etching a material layer disposed on a substrate comprising:
performing a pre-coating process on a substrate by supplying a gas mixture into a processing chamber and forming a plasma from the gas mixture by applying a first RF source power in the gas mixture;
performing an etching process on the substrate by applying a first RF bias power and a second RF bias power into the processing chamber while continuously applying the first RF source power in the processing chamber; and
performing a post-coating process on the substrate by turning off the first RF bias power and a second RF bias power applied into the processing chamber while continuously applying the first RF source power in the processing chamber, wherein the second RF bias power is turned off prior to the first RF bias power.

17. The method of claim 16, further comprising:
performing a pump/purge process in the processing chamber while turning off the first RF source power but continuously supplying the gas mixture into the processing chamber.

18. The method of claim 16, wherein the substrate includes a material layer disposed thereon, wherein the material layer is a silicon oxide layer, silicon nitride, alphamos silicon, or a composite layer including silicon oxide and polysilicon or silicon oxide and silicon nitride.

19. The method of claim 16, wherein the gas mixture includes at least a fluorine based gas and a polymer-rich carbon containing gas.

* * * * *